United States Patent [19]

Lippmann et al.

[11] Patent Number: 5,783,939
[45] Date of Patent: Jul. 21, 1998

[54] STEPPER MOTOR GAUGE CALIBRATION BY AC FEEDBACK

[75] Inventors: Raymond Lippmann, Ann Arbor; Gail Monica Sylvester, Frankenmuth; Michael John Schnars, Clarkston; Jeffrey Lynn Shepard, Lapeer; Ronald Kenneth Selby, Burton; James Edward Nelson, North Banch, all of Mich.

[73] Assignee: Delco Electronics Corporation, Kokomo, Ind.

[21] Appl. No.: 686,889

[22] Filed: Jul. 26, 1996

[51] Int. Cl.⁶ ........................................ G01R 1/00
[52] U.S. Cl. ........................... 324/154 R; 318/696
[58] Field of Search .................... 324/173, 174, 324/167, 144, 146, 151 R, 151 A, 154 R; 318/685, 696

[56] References Cited

U.S. PATENT DOCUMENTS 4,774,458  9/1988  Aronoff .............................. 324/146
5,032,781  7/1991  Kronenberg ........................ 318/696
5,287,050  2/1994  Kronenberg et al. ............... 318/696
5,489,842  2/1996  Lippmann et al. ................. 324/144

*Primary Examiner*—Walter E. Snow
*Attorney, Agent, or Firm*—Jimmy L. Funke

[57] ABSTRACT

A high frequency AC probe signal is applied to one coil of a stepper motor to induce a signal on the other coil. The induced signal varies in amplitude according to rotor position. The stepper motor is driven by a microprocessor in microsteps. The position of a mechanical stop is determined by monitoring the induced signal while driving the rotor to the stop. When the induced signal no longer changes in amplitude the number of the last microstep yielding movement is recorded as the rotor position corresponding to the stop position. Also by measuring the induced signal at each microstep over a whole rotor rotation and the signal when the rotor stops, a more precise value of the stop position is determined by interpolation. Alternatively, the flip back position of the gauge and thus the stop position is determined on the basis of the induced signal.

7 Claims, 4 Drawing Sheets

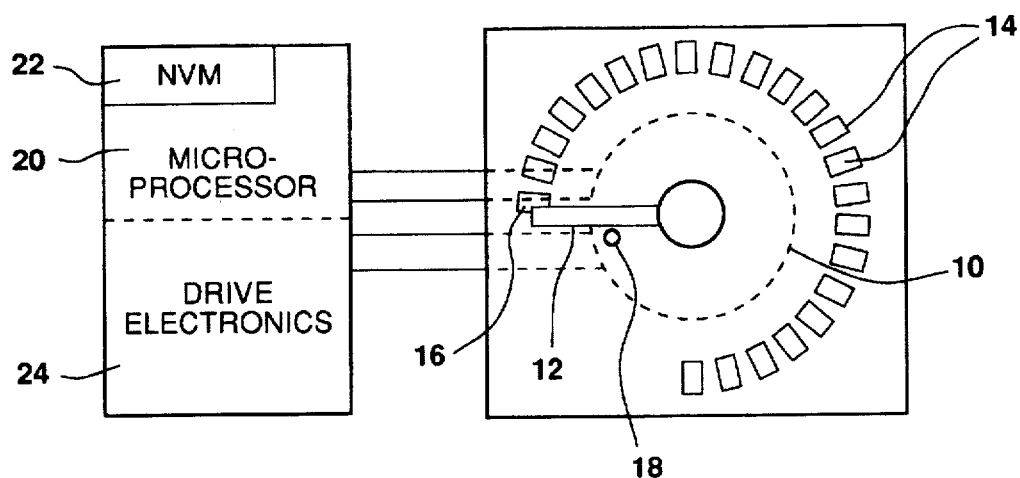
FIG - 1
PRIOR ART
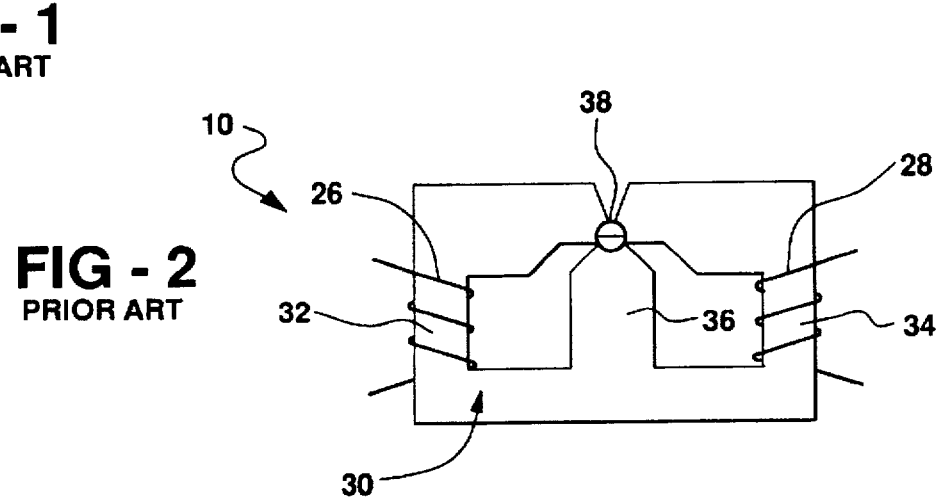
FIG - 2
PRIOR ART
FIG - 3
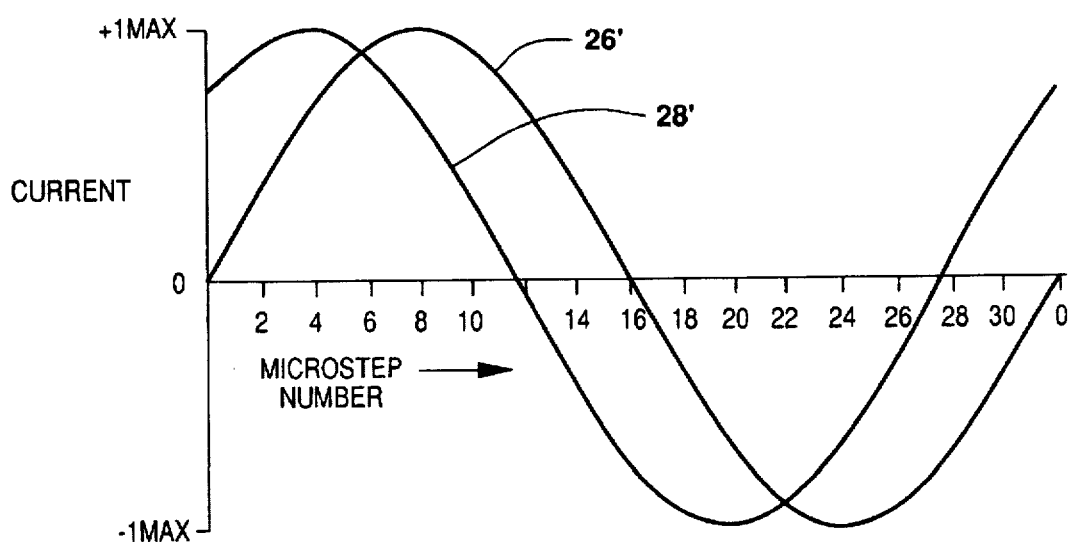

FIG - 4
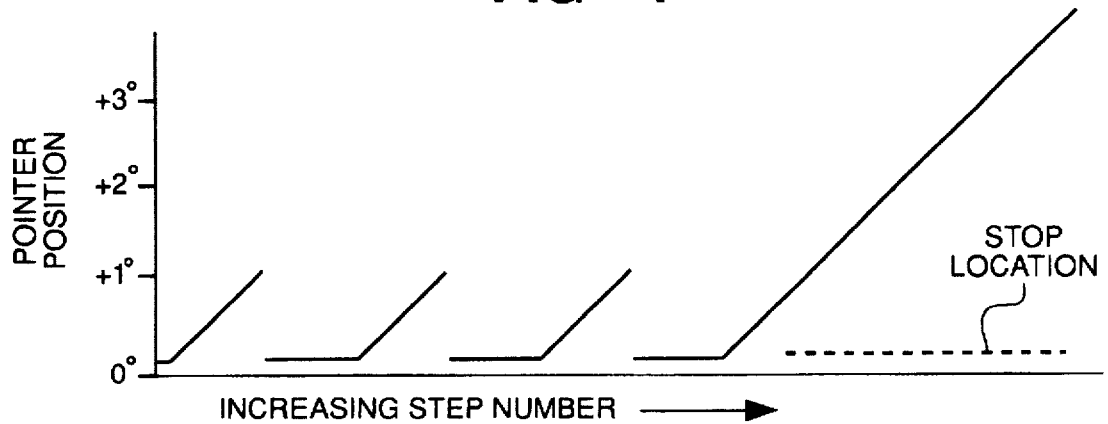
FIG - 5
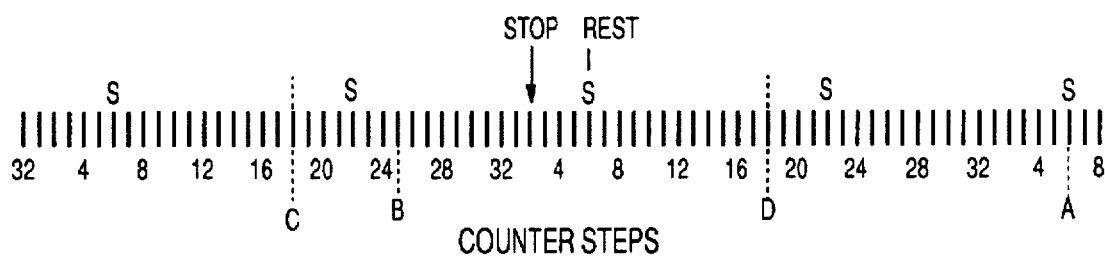
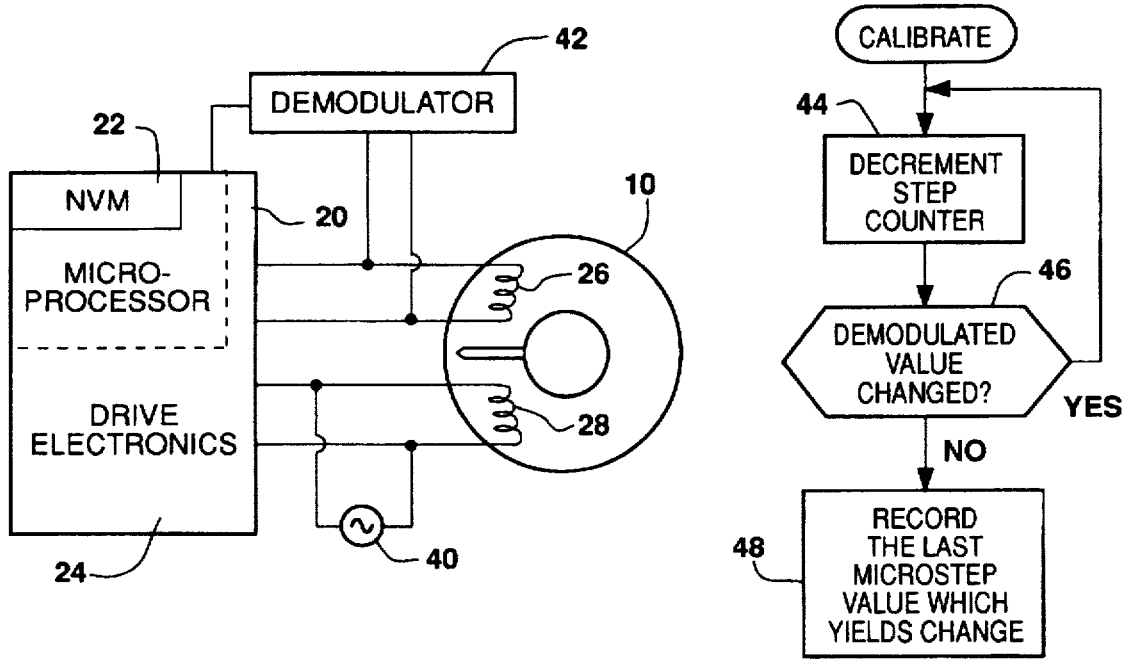
FIG - 6
FIG - 7

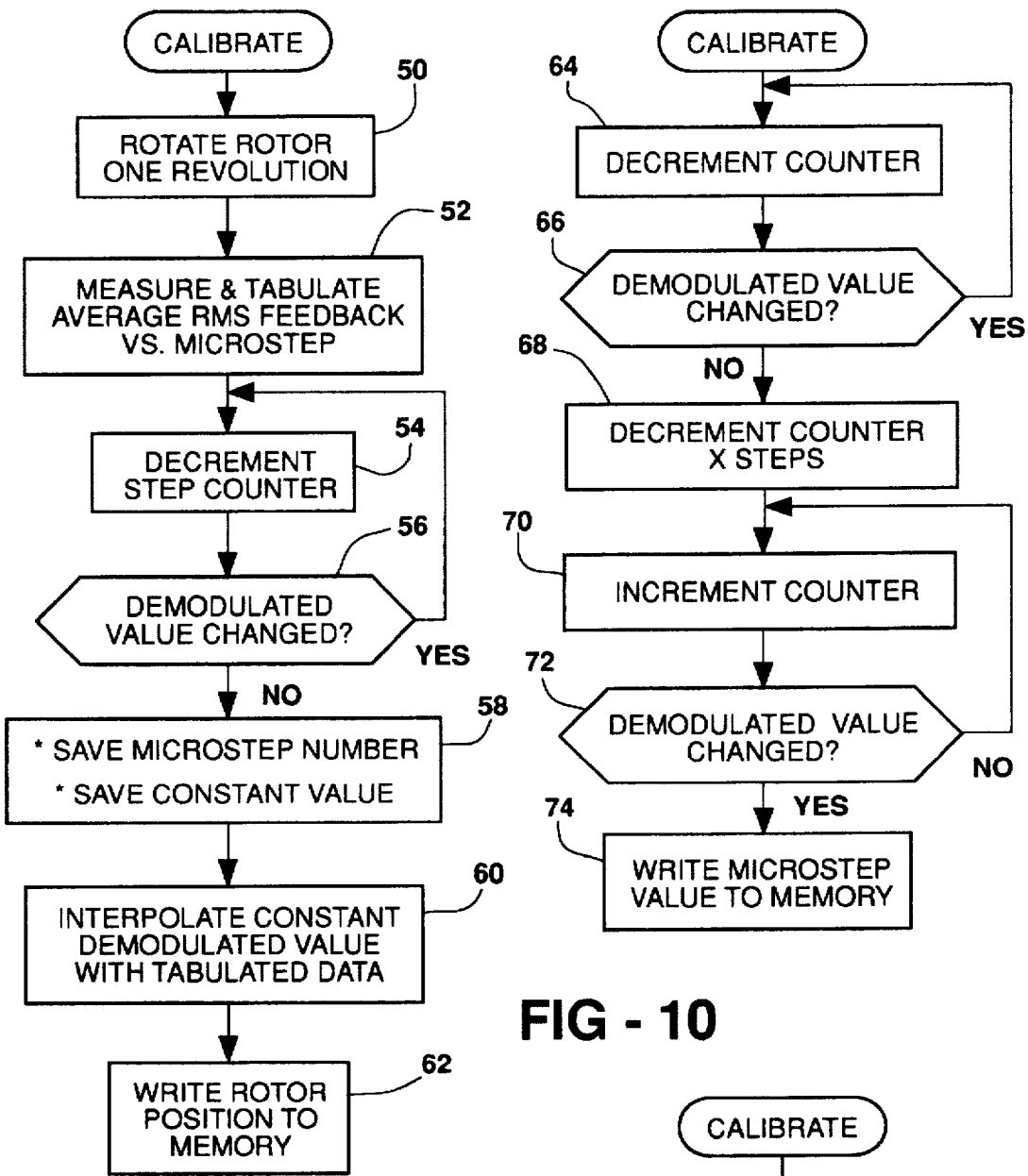
FIG - 9
FIG - 10
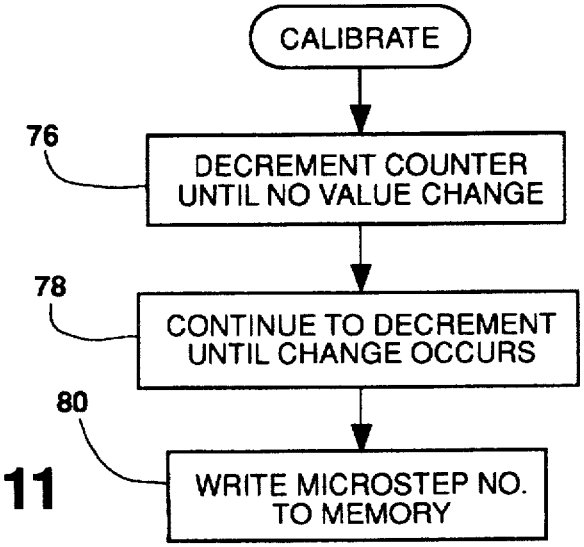
FIG - 11

STEPPER MOTOR GAUGE CALIBRATION BY AC FEEDBACK

FIELD OF THE INVENTION

This invention relates to stepper motor gauges and particularly to a method of correlating a mechanical stop position with the motor magnetic field position.

BACKGROUND OF THE INVENTION

Stepper motor gauges are being used increasingly in vehicle displays instead of traditional air core gauges because they exhibit improved accuracy, linearity, lower power consumption and they are easier to drive from a microprocessor. FIG. 1 shows a typical stepper motor application which includes a motor 10 driving a pointer 12 around a dial having graphical indicia 14. A zero indicia 16 at one end of the dial marks the beginning point of gauge measurement such as 0 MPH or Empty fuel level. The pointer is shown in a rest or home position at or near the zero position and a mechanical stop 18 (on the dial or elsewhere in the mechanism) prevents pointer excursion more than a slight amount below the rest position. A microprocessor 20 including a non-volatile memory (NVM) 22 and associated drive circuits 24 is coupled to two drive coils 26 and 28 of the motor 10, shown in FIG. 2.

The stepper motor described herein is a two pole motor but it should be understood that the invention is equally applicable to motors having a larger number of pole sets. The stepper motor 10 has a magnetically soft core 30 having first and second legs 32 and 34 wound with drive coils 26 and 28, respectively, and a common center leg 36. The three legs meet at a rotor 38 to supply a rotating electrical field to the rotor. The rotor 38 in this example is a two pole permanent magnet which rotates to align with the electrical field vector, although rotors with a larger number of pole pairs may be used. The rotor is coupled to the pointer 12 through a gear train, not shown. The two motor coils 26 and 28 are energized by drive currents 26' and 28' controlled by the drive electronics in the manner shown in FIG. 3. By controlling the magnitude and sequencing of the drive current waveforms, the rotor 38 can be made to rotate either in a forward (clockwise in this case) or reverse direction. The two waveforms are varied in a stepped sinusoidal or quasi-sinusoidal manner and the waveforms are separated by 60° of phase. Discrete current levels are output onto the two coils for each of 32 microsteps (in this example) which comprise 360° of field rotation (for a two pole motor) as well as rotor movement if the rotor movement is not obstructed by the stop 18. The microsteps are controlled by a step counter, state machine or other device which is incremented or decremented at a controlled rate, depending on the desired direction and speed of rotation. The count overflows or underflows every 32 microsteps and the sequence is repeated. Most stepper motor mechanisms use a gear train to reduce the angular motion of the rotor to allow for precise positional placement of the pointer and to enhance the fluid appearance of the pointer motion. The gain on the gear train is often in the range from 20:1 to 180:1. When the gear train has a gear ratio of 180:1, 360° of rotor rotation or 32 microsteps corresponds to 2° of pointer movement.

In some stepper motors the geometry of the motor core provides two natural stable or detent points for the two pole rotor. Adjacent points define a full motor step. These points are important when considering the behavior of the motor when the cluster is powered down. When power is removed from the motor, the rotor approaches equilibrium to the closest one of the two detent points and is used as a rest point. Other stepper motors are designed to minimize the stable detent effect, and when power is removed from the motor the rotor remains stationary due to friction. In this case, any point may be selected as a rest point.

When a gauge is driven in reverse against the stop 18 and the drive current continues to rotate the field, the gauge will be biased against the stop until the field rotates more than 180° beyond the stop. Then the rotor becomes unstable and moves 180° in the forward direction or "flips back" to align with the field. This is shown in FIG. 4 for a motor having a 180:1 gear reduction. Thus as the counter number decrements (moving from right to left) the rotor moves toward the stop location, and when it reaches the stop it remains stationary for 16 counts and then flips back 180° of the rotor or 1° of the pointer position. This cycle is repeated as long as the counter continues to decrement.

Gauges used in vehicle instrument clusters must often be accurate within a fraction of a degree of pointer rotation. Stepper motor gauges are usually operated in an open loop which makes it essential that the zero position be accurately known at all times during normal operation. A fixed number of microsteps forward from the starting position corresponds to the pointer display angle and any errors which might occur in counting the microsteps cause a display error which accumulates indefinitely during the life of the vehicle unless some measures are taken to calibrate the mechanism from time to time.

The counter values for the stable positions are known from the motor design. The placement of the mechanical stop varies from gauge to gauge, however. It is desired then to determine the position of the mechanical stop relative to the field so that the correct pointer position can be accurately determined using the stop as an absolute reference.

It is known in the case of air core gauges with orthogonal coils to use an AC excitation on one coil and measure the induced signal in the other coil as described in the U.S. Pat. No. 5,489,842 to Lippmann et al, entitled "METHOD OF FEEDBACK IN AIR-CORE GAUGES". The coils are coupled by the gauge rotor so that the value of the induced signal is dependent on the rotor position. It is further disclosed in the U.S. Pat. No. 5,287,050 to Kronenberg et al entitled "METHOD OF SYNCHRONIZATION FOR AN INDICATING INSTRUMENT WITH ELECTROMAGNETICALLY CONTROLLED STEPPING MOTOR" to use a similar arrangement with stepper motors having orthogonal coils to determine rotor position in the absence of driving current. It is desirable however to make rotor position determinations for gauge configurations where the coils are not necessarily orthogonal, and it is further desired to make such measurements while gauge driving current is applied to ensure stability of gauge position during the measurement.

SUMMARY OF THE INVENTION

It is therefore an object of the invention to calibrate stepper motor gauges of any coil configuration by high frequency feedback to determine the correlation of the resultant magnetic field position and a mechanical stop. A further object is to perform such calibration while driving current is applied to stepper motor coils.

An automotive gauge has a pointer coupled through gearing to a permanent magnet rotor of a stepper motor. The motor has non-orthogonal coils driven by a driving circuit including a microprocessor. The microprocessor drives the gauge in microstep increments by commanding incremental current changes in each coil to approximate sinusoidal wave forms. Each increment or microstep corresponds to a count representing field position. A mechanical stop limits gauge movement and is used as an absolute reference of gauge position. To calibrate the gauge during manufacture, a high frequency current is applied to one coil and a corresponding signal is induced in the other coil. The signal varies according to the rotor position because the rotor couples the two coils. While the high frequency current is applied and the feedback monitored, the drive current is applied to the coils to position the rotor.

In a first embodiment the rotor is driven toward the stop and the induced high frequency AC signal is monitored. The signal is constantly changing while the rotor is moving and when the rotor meets the stop the signal becomes substantially constant. At the point of transition from varying signal to constant signal, the microstep is recorded and used to define the correlation of the stop and the field.

The second embodiment is an enhancement of the first embodiment to measure stop positions between microsteps. Before being driven against the stop, the rotor is driven through at least one complete revolution and the AC signal is measured and stored at each microstep to define the feedback characteristics. Then when the gauge is driven to the stop, the constant AC signal amplitude is measured and the stop position between microsteps is determined by interpolation.

The third embodiment requires driving the gauge to the stop and continuing the field rotation somewhat beyond the stop so that the AC signal becomes constant, and then reversing the field rotation to move off the stop. The stop position is recognized when the AC signal starts to change; then the position is recorded.

The fourth embodiment takes advantage of the flip back property of a gauge wherein when a field rotates beyond the stop position at least 180°, the rotor quickly moves off the stop to align with the field. By monitoring the AC feedback signal the flip back event is detected and the microstep count at that time is used to correlate to the stop position.

BRIEF DESCRIPTION OF THE DRAWINGS

The above and other advantages of the invention will become more apparent from the following description taken in conjunction with the accompanying drawings wherein like references refer to like parts and wherein:

FIG. 1 is a schematic view of a prior art stepper motor gauge assembly;

FIG. 2 is a view of a stepper motor used in the assembly of FIG. 1;

FIG. 3 is a waveform diagram illustrating the electrical drive currents for the gauge of FIG. 1;

FIG. 4 is a graphical illustration of stepper motor flip back operation;

FIG. 5 is a diagram illustrating the relationship of counter microsteps, stable positions and a stop;

FIG. 6 is a diagram of a system for correlating the stop and the motor position according to the invention;

FIG. 7 is a flow chart representing a feedback method of correlating the stop and the motor position according to the invention;

FIG. 9 is a flow chart representing a second feedback method of correlating the stop and the motor position according to the invention;

FIG. 10 is a flow chart representing a third feedback method of correlating the stop and the motor position according to the invention;

FIG. 11 is a flow chart representing a fourth feedback method of correlating the stop and the motor position according to the invention;

DESCRIPTION OF THE INVENTION

Figure 8:
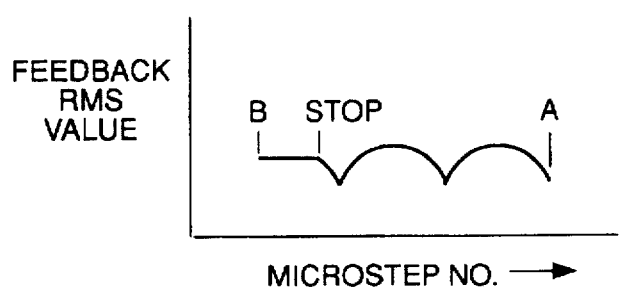
FIG. 8 is a diagram of feedback RMS value versus microstep number which illustrates the method of FIG. 7.

FIG. 5 illustrates microstep numbers as recorded in the step counter. In this example each rotor rotation requires 32 microsteps. For this example, stable rotor positions occur approximately at microsteps 6 and 22 which are indicated by the letters S. A mechanical stop in the gauge is here shown to be at microstep position 2, but during gauge manufacture the intent is to place the stop at or just below the graphics zero of the gauge, and the actual position of the stop varies from gauge to gauge. According to this invention, a high frequency feedback method is used during manufacture to identify the stop position. The method is most effectively applied when the stepper motor is already assembled to the microprocessor 20 and drive electronics 24, and the motor is assembled to the instrument cluster with the pointer installed to register with the cluster graphics. Then the calibration of the stop position is carried out and the microstep number corresponding to stop position is stored in the NVM 22 for reference each time the gauge is started up in use.

Referring to FIG. 6, the drive electronics are coupled to motor coils 26 and 28. A signal generator 40 is coupled to the coil 28 to apply a high frequency sinusoidal waveform superimposed on the normal drive signal on coil 28. The coils 26 and 28 are not orthogonal and thus the AC signal is always inductively coupled from coil 28 to coil 26. The degree of coupling varies according to the position of the rotor. The coupling also varies with the applied AC frequency, and it has been determined that for some motors the optimum frequency for most effective coupling is on the order of 20 kHz. The feedback signal induced on coil 26 is extracted by a demodulator 42 which determines the RMS value of the feedback signal and supplies that data to the microprocessor 20.

The flow chart of FIG. 7 illustrates the first embodiment of a method to establish the stop position. In this and subsequent flow charts the functional description of each block in the chart is accompanied by a number in angle brackets <nn> which corresponds to the reference number of the block. To calibrate the gauge for stop position the step counter of the microprocessor is decremented <44> to drive the rotor back toward the stop and the demodulated value of the feedback signal is monitored <46>. If the value changes the step counter is further decremented. If the value ceases to change it is an indication that the rotor position had already reached the stop, and the last microstep value which results in a change is written to non-volatile memory 22 <48>.

This process is graphically illustrated in FIG. 8 which shows the variation of the feedback RMS value. Assuming the rotor starts at the stable position A (also shown in FIG. 5) the counter is decremented until the stop is reached. The RMS value of the feedback changes at each microstep until the stop is reached and the rotor can no longer follow the changing field position. In this manner the stop position is determined to the nearest microstep.

To obtain still more precise measure of the stop position, according to a second embodiment, the value of the demodulated feedback is used to interpolate between microstep counts. Referring to FIG. 9, the rotor is rotated at least one revolution <50> and the RMS value of the feedback is measured at each microstep, averaged for each microstep and stored in a table <52>. Following the tabulation the counter is decremented <54> until the demodulated value no longer changes <56> and the microstep number as well as the constant demodulated RMS value is saved <58>. Then the constant value is interpolated <60> between the saved microstep number and the adjacent number on the basis of the tabulated data to establish the stop position between two microstep numbers and that position is written to memory <62>.

A third embodiment comprises driving the rotor field back to some point B (FIGS. 5 and 8) beyond the place where the gauge hits the stop and then driving the field forward to detect where the rotor begins to move off the stop. As shown in the flow chart of FIG. 10, the counter is decremented <64> until the demodulated value stops changing <66> and then the counter is decremented a few steps more to step B <68>. Then the counter is incremented to rotate the field forward <70> and when the rotor moves from the stop a change in the demodulated value is detected <72> and the microstep value at that point is written to memory <74>.

Figure 12:
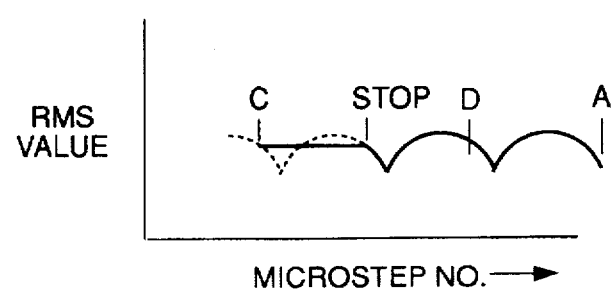
FIG. 12 is a diagram of feedback RMS value versus microstep number which illustrates the method of FIG. 11.
Figure 13:
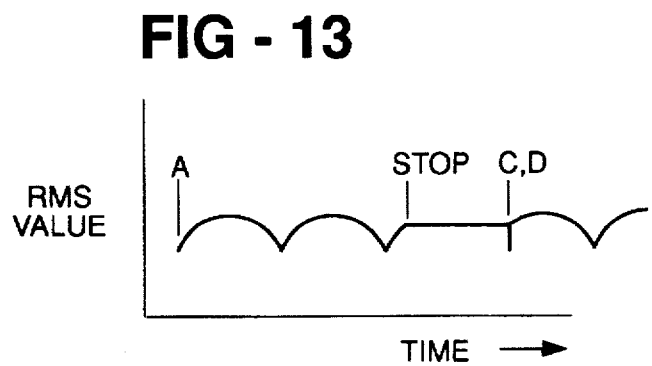
FIG. 13 is a diagram of feedback RMS value versus time which illustrates the method of FIG. 11.

A fourth embodiment utilizes the flip back property of a stepper motor as illustrated in FIG. 4. When the motor is driven against a stop and the field continues to rotate back at least 60° the rotor will quickly advance 60° to align with the field. This flip back point can be identified by the feedback method of calibration. That point can be used as the memorized reference value or 60° (16 steps for a 32 step cycle) can be added to the point. As shown in FIG. 11, the counter is decremented until no change is seen in the value <76> and decrementing is further continued until a change in the RMS value is seen <78>. The microstep number at that point or the number plus 16 is memorized <80>. FIG. 12 shows the RMS value with decreasing microstep value beginning at point A. When the stop is reached the field continues to rotate, as shown in dashed lines, but the RMS value is static until the field reaches point C. Then the rotor rapidly rotates from the stop to point D which is 180∞ above the stop causing the change in the RMS value. The RMS value versus time is shown in FIG. 13; after reaching the stop the feedback signal is constant until point C is reached and then the flip back is registered as a change of the signal and then the normal signal change ensues as the decrementing continues to move the rotor toward the stop again. If desired, more than one flip back is triggered and the values are averaged for improved accuracy.

Figure 14:
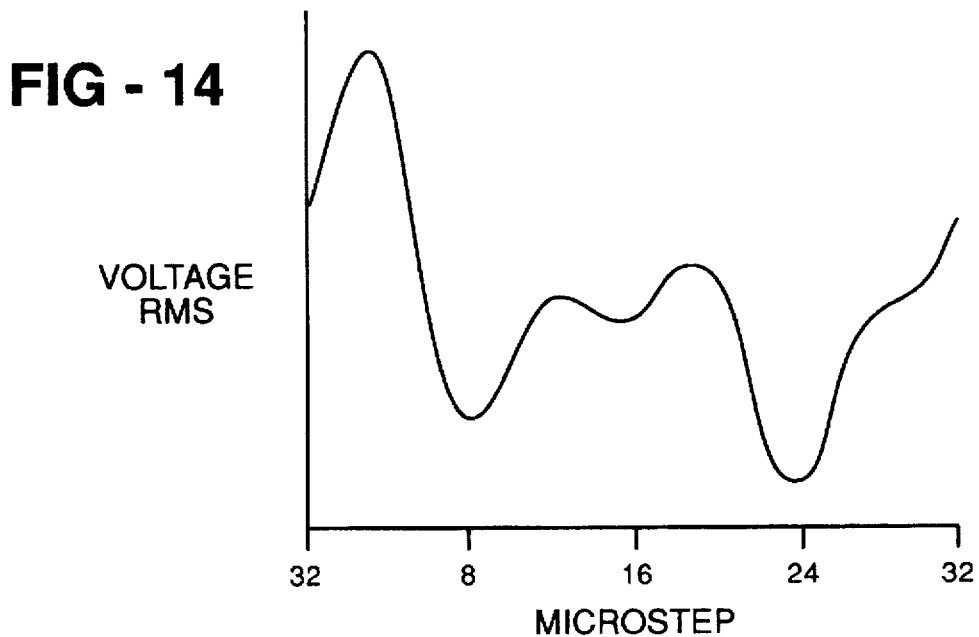
FIG. 14 is a diagram of a feedback RMS waveform for a complete rotor revolution measured for a stepper motor of the type shown in FIG. 2.

The waveforms shown in FIGS. 8, 12 and 13 are generalized to effectively illustrate the operational principal of the invention. The actual feedback waveform, however, is highly dependent on the type of motor employed. Measurements of feedback for a motor of the type depicted in FIG. 2 yield a waveform like that shown in FIG. 14. The operability of the method does not depend on the particular waveform.

It will thus be seen that the high frequency feedback method of detecting gauge movement is an easy way of correlating stop position to rotor field position and requires no added gauge circuitry and only simple microprocessor programming to accomplish the measurement in any of several ways. The assembly station requires only a signal generator and an extraction circuit including a demodulator to support the calibration.

The embodiments of the invention in which an exclusive property or privilege is claimed are defined as follows:

1. In a gauge driven by a stepper motor gauge having a rotating field controlled by a motor driver, first and second driving coils carrying DC current controlled to establish the field for rotation of the rotor, and a mechanical stop for limiting rotor movement, a method of correlating the stop position with field position comprising the steps of:

inducing an AC signal in the second coil as a function of rotor position by applying an AC current to the first coil, whereby coupling between the coils varies according to rotor position;

sensing rotor movement by detecting change in the AC signal in the second coil wherein an absence of change in the AC signal indicates a stationary rotor;

controlling the DC current to drive the rotor;

detecting an AC signal transition between a continuously changing mode and a non-changing mode, which transition occurs when the rotor changes between moving and stationary states due to interacting with the stop; and recording the field position when the transition is detected, whereby the recorded position corresponds to the mechanical stop position.

2. The invention as defined in claim 1 wherein:

the DC current is controlled to drive the rotor toward the stop;

the step of detecting a transition comprises detecting cessation of change in the AC signal due to stopping the rotor; and the recording step comprises recording the last field position in the changing mode.

3. The invention as defined in claim 1 wherein:

the step of controlling the DC current to drive the rotor includes controlling the DC current to rotate the field to move the rotor against the stop and then to continue to rotate the field beyond the stop, and reversing the field rotation to move the rotor from the stop; and the step of detecting a transition comprises detecting change in the AC signal due to moving the rotor from the stop.

4. The invention as defined in claim 1 wherein:

the step of controlling the DC current to drive the rotor includes controlling the DC current to rotate the field to move the rotor against the stop and then to continue to rotate the field beyond the stop until the rotor rapidly rotates back from the stop to align with the field; and the step of detecting a transition comprises detecting change in the AC signal due to the rotor rotating back from the stop.

5. The invention as defined in claim 1 wherein a microprocessor controls the currents in the driving coils in incremental microsteps wherein a fixed number of microsteps comprises a full motor step, including:

monitoring the field position by counting the microsteps; and the step of recording the field position comprises recording the microstep count when the transition is detected.

6. The invention as defined in claim 1 including:

determining the AC signal characteristics over a complete rotor rotation;

determining the AC signal value when the rotor is against the stop;

calculating the rotor position from the recorded field position, the AC signal and the AC characteristics, whereby the calculated rotor position is the mechanical stop position.

7. The invention as defined in claim 1 wherein a microprocessor controls the currents in the driving coils in incremental microsteps, including:

monitoring the field position by counting the microsteps;

rotating the rotor over a complete revolution and compiling a wave form characteristics table by recording the AC signal for each microstep;

rotating the motor to the stop and recording the value of the AC signal and the microstep when the transition is detected; and the step of recording the field position includes using the microstep, the recorded value of the AC signal and the table for interpolating the field position.

* * * * *